United States Patent [19]

Giraud et al.

[11] 3,711,851

[45] Jan. 16, 1973

[54] METHOD FOR CORRECTING SYSTEMATIC ERRORS IN DIFFERENTIAL LINEARITY OF A PULSE HEIGHT-TO-TIME CONVERTER AND CONVERTER FOR THE APPLICATION OF SAID METHOD

[75] Inventors: Pierre Giraud, Paris; Michel Redon, Villennes-sur-Seine, both of France

[73] Assignee: Intertechnique S. A., Plaisir, France

[22] Filed: Dec. 10, 1969

[21] Appl. No.: 883,883

[30] Foreign Application Priority Data

Dec. 12, 1968 France ............................68177836

[52] U.S. Cl. ......................340/347 CC, 340/347 NT

[51] Int. Cl. ..........................................H03k 13/02

[58] Field of Search................. 340/347 AD; 324/99; 235/92 CC

[56] References Cited

UNITED STATES PATENTS

| | | | |
|---|---|---|---|
| 3,603,773 | 9/1971 | Carlstein | 235/92 CC |
| 3,445,840 | 5/1969 | Carlstead | 235/92 PL |
| 3,349,390 | 10/1967 | Glassman | 235/92 PL |
| 3,316,547 | 4/1967 | Ammann | 340/347 NT |
| 3,316,751 | 5/1967 | Burk | 340/347 CC |
| 3,349,390 | 10/1967 | Glassman | 340/347 WT |
| 3,462,758 | 8/1969 | Reynal | 340/347 NT |
| 3,493,961 | 2/1970 | Hansen | 340/347 CC |

*Primary Examiner*—Maynard R. Wilbur
*Assistant Examiner*—Jeremiah Glassman
*Attorney*—Lane, Aitken, Dunner & Ziems

[57] ABSTRACT

A digital counter records the pulses delivered by an oscillator during a time interval which is substantially proportional to the amplitude of each signal to be converted. Prior to each conversion, the counter is set in any initial state and the result of the conversion is modified in order to take said initial state into account.

14 Claims, 1 Drawing Figure

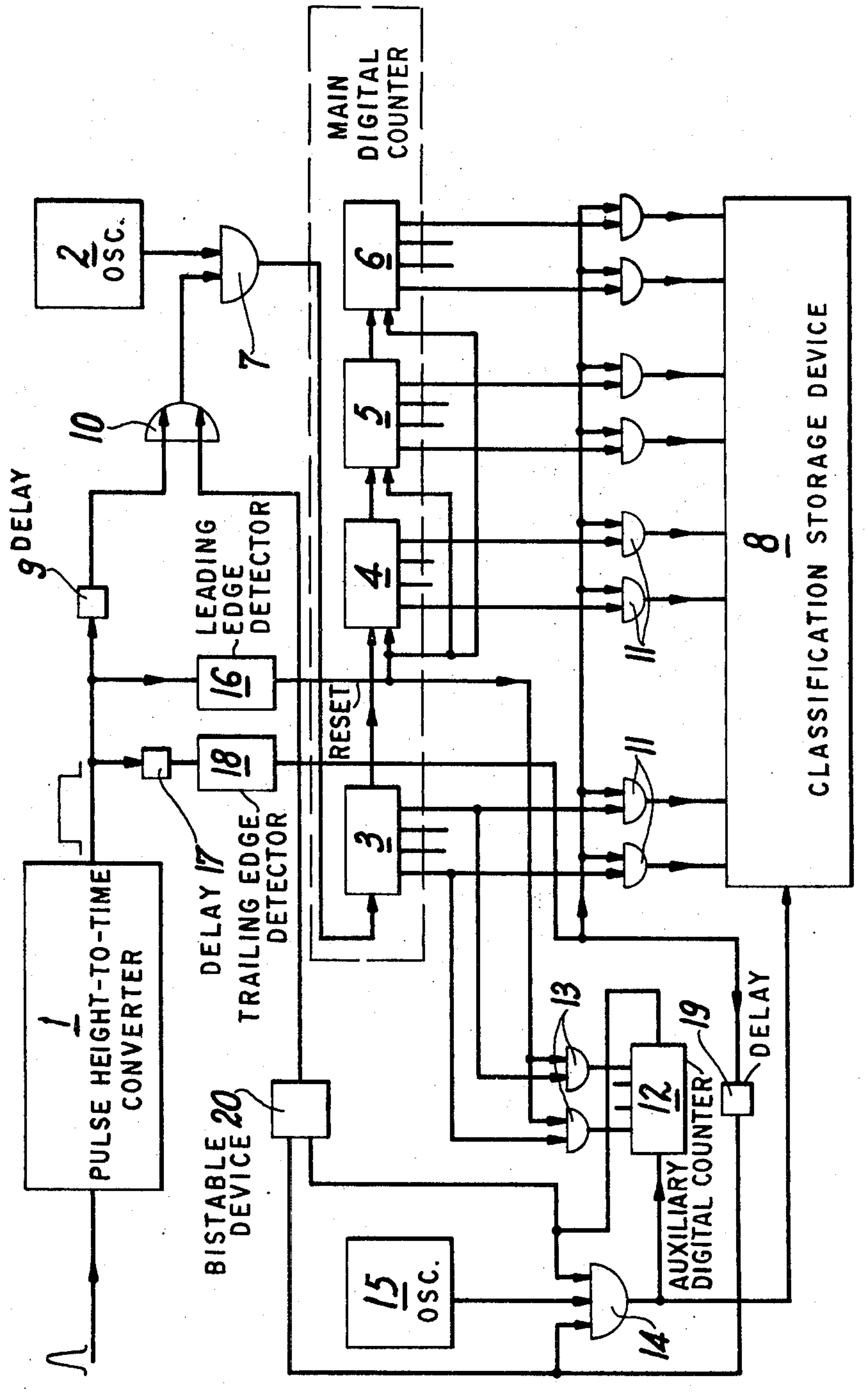
INVENTOR
PIERRE GIRAUD &
MICHEL REDON
BY
Lane, Aitken, Dunner & Ziems
ATTORNEY

METHOD FOR CORRECTING SYSTEMATIC ERRORS IN DIFFERENTIAL LINEARITY OF A PULSE HEIGHT-TO-TIME CONVERTER AND CONVERTER FOR THE APPLICATION OF SAID METHOD

This invention is concerned with a method for correcting systematic errors in differential linearity of a pulse height-to-time converter. In this context, errors in differential linearity of a converter are understood to mean the variations in width of each unitary division of conversion, or channel, with respect to the width of adjacent channels. The invention is also concerned with a pulse height-to-time converter for carrying out said method.

It is known that a pulse height-to-time converter which is also referred-to as a Wilkinson converter produces a rectangular voltage pulse having a time duration which is proportional to the amplitude of the signal to be converted and opens a gate through which a digital counter receives the recurrent pulses of an oscillator. The state of the counter at the time of closure of the gate thus represents the code of the signal which is analyzed.

Although there is no a priori reason for poor differential linearity of a converter of this type (as is the case with converters which operate on the principle of successive approximations), it has nevertheless been found that systematic errors arise from the changes of state of the digital counter in certain particular configurations of its bistable circuits or flip-flops. When they occur close to the instant at which the decision for end of conversion has to be made, said changes of state produce a transient electrical disturbance which has the effect of either advancing or retarding said instant. A virtual modulation of the length of the rectangular signal is thus carried out by the counter itself. Thus, some pulses are systematically coded as numbers which are either too high or too low and the corresponding channels are systematically of either greater or smaller width than the other channels.

This undesirable modulation arises mainly in the first stage of the counter which operates at the same frequency as the oscillator. In consequence, the error occurs periodically every ten or every sixteen channels depending on whether a decimal or binary representation is used and becomes all the more appreciable as the frequency is higher (this frequency attains 100 Mc/s in high-performance converters).

The primary object of the present invention is to correct these systematic errors in differential linearity. The solution which is proposed does not in any way affect the channel profile and even serves to correct a number of other errors such as in particular those which arise from even-odd effects of the oscillator.

More specifically, the present invention is directed to a method for correcting systematic errors in differential linearity of a pulse height-to-time converter in which a digital counter records the pulses delivered by an oscillator during a time interval which is substantially proportional to the amplitude of each signal to be converted, wherein said method consists prior to each conversion in setting said counter in any initial state, then in modifying the result of the conversion in order to take said initial state into account.

Thus, instead of coding some signals as numbers which are systematically either too high or too low, all the converted signals are subjected to the same aforementioned effects, thereby achieving uniformity in the variation in width of adjacent channels.

In order that the counter should be in any state on commencement of a conversion, the state in which it was left after the previous conversion may be maintained without resetting to zero. However, in order to enhance the efficiency of correction, it is preferable to ensure in addition that a variable advance is given to the counter.

This invention is also directed to a pulse height-to-time converter which is intended to carry out said method and comprises a circuit for producing a rectangular voltage pulse having a time duration which is substantially proportional to the amplitude of the signal to be converted, an oscillator, a main digital counter having a number of stages in series, a gate which is held open by said rectangular voltage pulse throughout the duration thereof and which permits the pulses emitted by said oscillator to pass to said main counter, a storage device for the classification of results indicated by the counter, an auxiliary digital counter comprising at least one stage which is connected in parallel with the first stage of the main counter, a control system for causing the contents of said first stage of the main counter to be transferred to said auxiliary counter at the beginning of each conversion, and means for correcting the result of conversion which is supplied to the classification storage device while taking into account the number initially indicated by the first stage of the main counter.

Further properties of the present invention will become apparent from the following description of the method adopted for correcting systematic errors in differential linearity which exist in a pulse height-to-time converter comprising a decimal digital counter and which essentially arise in the first decade scaler of said counter. This description is given solely by way of explanation without any implied limitation, reference being made to the single accompanying FIGURE which is a schematic presentation of the circuit arrangement employed, the pulse height-to-time converter being composed of the following main elements:

a circuit 1 in which a rectangular voltage pulse having a time duration which is proportional to the amplitude of the signal to be converted is produced by charging a capacitor through a circuit having low internal impedance;

an oscillator 2;

a main digital counter having four decade scalers in series 3, 4, 5 and 6;

and AND gate 7 which is "opened" or triggered into conduction by the rectangular voltage pulse so that the recurrent pulses delivered by the oscillator 2 can thus be transmitted through said gate to the first decade scaler 3 of the counter;

and a classification storage device 8.

The rectangular signal which is produced by the circuit 1 is applied via a time delay circuit 9 and an OR gate 10 to one input of the AND gate 7, the other input of which is connected to the oscillator 2. The outputs of the four decade scalers of the counter are coupled in parallel with the classification storage device 8 via AND gates 11. The outputs of the first decade scaler 3 are additionally coupled with an identical auxiliary decade scaler 12 via AND gates 13. The output of a three-input AND gate 14 is connected on the one hand to the series input of said decade scaler and on the other hand to the series input of the storage device 8. One input of said gate is connected to an oscillator 15 whilst another input is connected to the series output of the auxiliary decade scaler 12. The rectangular signal which is produced by the circuit 1 is also applied on the one hand directly to a differentiating circuit 16 which is intended to detect the leading edge of said signal and on the other hand via a time-delay circuit 17 to a second differentiating circuit 18 which is intended to detect the trailing edge of said signal. The circuit 16 delivers the signal which resets the decade scalers 4, 5 and 6 and at the same time triggers the AND gates 13 into conduction, thereby resulting in transfer of the contents of the scaler 3 to the auxiliary scaler 12 without resetting of the scaler 3. The circuit 18 supplies the signal which triggers the AND gates 11 into conduction, thereby initiating the transfer of the contents of the scalers 3, 4, 5 and 6 to the classification storage device 8. The same signal is also subjected to a time-delay circuit 19 and then applied on the one hand to the third input of the AND gate 14 and on the other hand to a bistable device 20 which is thereby set in state "1". Said bistable device is also connected to the series output of the decade scaler 12 which controls resetting of said device to state "0". When said bistable device is in state "1", the AND gate 7 is activated via the OR gate 10.

The circuit arrangement described in the foregoing operates as follows: when a rectangular voltage pulse appears at the output of the circuit 1, the leading edge of said pulse which is detected by the circuit 16 first resets the decade scalers 4, 5 and 6 of the main counter and transfers the contents of the first decade scaler 3 to the auxiliary decade scaler 12. After passing through the time-delay circuit 9 and being delayed for a period which is sufficient to ensure completion of the two operations just mentioned, said pulse activates or opens the AND gate 7. The four decade scalers, the first of which has not been reset, then begin to count the pulses delivered by the oscillator 2. The disappearance of the pulse causes the gate to return to its nonconducting state with the result that, at this instant, the counter indicates a number N which represents the sum of the number n as initially indicated by the first decade scaler 3 and stored in the decade scaler 12 and of the number N′ representing the code of the analyzed signal which is subjected to the circuit 1.

The trailing edge of the rectangular signal which is delayed by the time-delay circuit 17 for the period of time which is necessary to stop the decade scalers is then detected by the circuit 18. This circuit delivers a signal which triggers the AND gates 11 into conduction and thus initiates the transfer of the number indicated by the main counter to the storage device 8, the address of this latter being then positioned at the value which designates the channel having the number $N = n + N'$. The same signal which is delayed at 19 throughout the duration of said transfer opens the AND gate 14 which permits the transmission of the pulses produced by the oscillator 15 to the series inputs of the decade scaler 12 and of the storage device 8. When said decade scaler changes from position "9" to position "0", a signal emitted on its series output closes the AND gate 14. In consequence, $(10 - n)$ pulses are received by the storage device 8 whose address then assumes the value:

$$(n+N')+(10-n),$$

that is to say $N' + 10$. Thus, a signal which should normally be coded as $N'$ is coded as $N' + 10$ in this system. This difference which is independent of $N'$ is readily compensated by the analog method.

Under these conditions and since the decade scaler 3 is not reset at the commencement of a conversion sequence, it is readily apparent that said scaler can indicate all the digits between 0 and 9 in respect of a signal having a given amplitude. In consequence, instead of systematic coding of some signals as numbers which are either too high or too low with a resultant equivalent increase or decrease in width of corresponding channels, all the signals which are processed can be subjected to the same effects of disturbances which may arise in some bistable devices of the first decade scaler 3. Errors are thus compensated in all channels.

When the signal which detects the trailing edge of the rectangular pulse has been applied simultaneously to the input of the AND gate 14 and to the bistable device 20 which is consequently set in state "1", said bistable device again activates the AND gate 7, with the result that the main counter again commences to register the pulses of the oscillator 2. The signal which appears at the series output of the decade scaler 12 causes the bistable device to return to state "0" and the AND gate 7 then closes.

This variable advance of the counter which is constituted by the decade scalers 3, 4, 5 and 6 during the changeover from position "9" to position "0" of the scaler 12 makes it possible to improve the efficiency of the circuit. It can in fact be readily seen that, if provision were not made for this variable advance and if the first decade scaler 3 were to indicate the value "0" at the end of a conversion sequence, the circuit would accordingly be ineffective when the result of the following conversion is expressed as a number which terminates in "0". Similarly, if the first decade were to indicate the value "5" at the end of a sequence and if a number of subsequent pulses were to cause the counter to advance by a number which terminates in "5", said decade scaler would indicate a series of "0" and of "5"; in this case, the effectiveness of the circuit would therefore be very limited.

Although such cases are relatively infrequent under conditions of normal operation of the converter, the same does not apply when testing its differential linearity since series of pulses having substantially the same amplitude are then applied to the converter. The systematic change of state of the first decade scaler between two conversions therefore makes it possible to remove this drawback.

It will be understood that the present invention is not limited to the embodiment which has been described by way of example with reference to the accompanying figure and that the scope of this patent also extends to alternative forms of all or part of the arrangements herein described which remain within the definition of equivalent means as well as to any application of such arrangements. In particular, consideration has been given in the foregoing description to a circuit which makes use of a decimal counter and carries out only the correction of systematic errors in differential linearity arising in the first decade scaler of said counter. However, it remains apparent that the correction can be applied to all the decade scalers of the assembly, in which case the auxiliary counter is identical with the main counter. Moreover, in the method hereinbefore described, the complement on "10" of the number n which was initially indicated by the decade scaler 3 has been added to the result of the conversion. However, it is certainly feasible to proceed in any other manner, in particular by subtracting the number n which is held in the storage device 12 from the result in the conversion. Similarly, the system is applicable to a binary counter as well as to a decimal counter.

We claim:

1. A method for correcting errors in differential linearity of a pulse height-to-time converter over a plurality of successive conversions in which a main digital counter records the number of pulses delivered by an oscillator during a time interval which is substantially proportional to the amplitude of each signal to be converted, wherein each one of a plurality of successive conversion operations comprises the steps of presetting said main counter to an initial number, storing the initial number an auxiliary digital counter prior to each conversion and then in modifying each result of the conversion by subtracting the initial number stored in said auxiliary counter from the number indicated by said main counter following each conversion.

2. A method according to claim 1, wherein the presetting of said main counter is accomplished by maintaining prior to each conversion the state in which said main counter was left after the previous conversion without resetting said main counter to zero.

3. A method according to claim 1, wherein the presetting of said main counter is accomplished by maintaining said main counter in the state in which it was left after the previous conversion without resetting, and then giving said main counter a variable advance prior to each conversion.

4. A pulse height-to-time converter, comprising a circuit for producing a rectangular voltage pulse having a time duration which is substantially proportional to the amplitude of the signal to be converted, a main oscillator, a main digital counter having a number of stages in series, a gate connected between said main oscillator and said main counter which is held open by said rectangular voltage pulse throughout the duration thereof and which permits the pulses emitted by said main oscillator to pass to said main counter, an auxiliary digital counter comprising at least one stage which is connected to receive the output of the first stage of said main counter, a control system for causing the contents of said first stage of said main counter to be transferred to said auxiliary counter for storage at the beginning of each conversion, and means for correcting the result of conversion including circuit means connected to said auxiliary counter and said main counter for subtracting the initial contents of said first stage stored in said auxiliary counter from the contents of said main counter after said gate has closed following conversion.

5. A pulse height-to-time converter according to claim 4, wherein said control system includes an element for detecting the leading edge of the rectangular voltage pulse and AND gate means operatively inserted between the first stage of said main counter and said auxiliary counter, the opening of said gate means being carried out by said detection element.

6. A pulse-height-to-time converter according to claim 4, wherein said means for correcting the result of the conversion further includes an element for detecting the trailing edge of the rectangular voltage pulse, said subtraction circuit means being controlled thereby.

7. A pulse height-to-time converter according to claim 6, wherein said subtraction circuit means includes a circuit controlled by said detection element for adding the complement of the initial contents of said first stage indicated by said auxiliary counter to the contents of said main counter following conversion.

8. A pulse height-to-time converter according to claim 7, wherein said adding circuit comprises a storage device connected to receive the contents of said main counter, and auxiliary oscillator, an AND gate having three inputs connected respectively to said detection element, to said auxiliary oscillator and to the series output of said auxiliary counter, the output of said AND gate being connected to the series input of said auxiliary counter as well as to said storage device, said storage device registering the sum of the contents of said main counter and the number of pulses in the output of said AND gate.

9. A pulse height-to-time converter according to claim 4, comprising a system for causing the main counter of the converter to advance by a variable quantity prior to each conversion.

10. A pulse height-to-time converter according to claim 8, further comprising a system for causing said main counter to advance by a variable quantity prior to each conversion including a bi-stable device connected to said detection element and said auxiliary counter for initiating the opening of the gate which precedes said main digital counter when said device is set into one state by the detection element output signal which indicates the trailing edge and for closing said gate when reset into the other state by the signal which appears at the series output of said auxiliary counter.

11. A method according to claim 1, wherein the subtracting of the initial number stored in said auxiliary counter is accomplished by adding the complement of the initial number to the number indicated by said main counter following conversion.

12. A method according to claim 3, wherein the amount of said variable advance is controlled by the initial number stored in said auxiliary counter.

13. A pulse height-to-time converter according to claim 8, further comprising control gate means receiving the output of said detection element operatively disposed between said main counter and said storage device for passing the contents of said main counter to said storage device on the occurrence of the trailing edge of the rectangular voltage pulse.

14. A pulse height-to-time converter, comprising a circuit for producing a rectangular voltage pulse having a time duration which is substantially proportional to the amplitude of the signal to be converted, a main oscillator, a main digital counter having a plurality of stages in series, a gate connected between said main oscillator and said main counter which is held open by said rectangular voltage pulse throughout the duration thereof and which permits the pulses emitted by said main oscillator to pass to said main counter, an auxiliary digital counter having a single stage which is connected to receive the output of the first stage of said main counter, a control system for causing the contents of said first stage of said main counter to be transferred to said auxiliary counter for storage at the beginning of each conversion, and means for correcting the result of conversion including circuit means connected to said auxiliary counter and said main counter for subtracting the initial contents of said first stage stored in said auxiliary counter from the contents of said main counter after said gate has closed following conversion.

* * * * *